(12) United States Patent
Taya et al.

(10) Patent No.: US 9,148,185 B2
(45) Date of Patent: Sep. 29, 2015

(54) FILTER CIRCUIT AND RECEIVING APPARATUS

(71) Applicant: LAPIS Semiconductor Co., Ltd., Yokohama (JP)

(72) Inventors: Takashi Taya, Yokohama (JP); Satoshi Tachi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/266,160

(22) Filed: Apr. 30, 2014

(65) Prior Publication Data

US 2014/0328440 A1    Nov. 6, 2014

(30) Foreign Application Priority Data

May 2, 2013  (JP) ................. 2013-096885

(51) Int. Cl.
  *H04B 1/10*   (2006.01)
  *H03H 11/12*  (2006.01)
  *H03H 11/04*  (2006.01)

(52) U.S. Cl.
  CPC ............ *H04B 1/1036* (2013.01); *H03H 11/12* (2013.01); *H03H 2011/0494* (2013.01); *H04B 2001/1063* (2013.01)

(58) Field of Classification Search
  CPC ................. H04L 25/03038; H04L 27/2647; H04B 1/1036; H04B 2001/1063; H03H 11/12; H03H 2011/0494
  See application file for complete search history.

(56) References Cited

U.S. PATENT DOCUMENTS 4,180,804 A *  12/1979  Watanabe et al. ............ 455/3.02
2006/0058001 A1 *  3/2006  Minnis et al. ................ 455/334

FOREIGN PATENT DOCUMENTS

JP  2004-515104 A   5/2004
JP  2008-205962 A   9/2008

* cited by examiner

*Primary Examiner* — Ted Wang
(74) *Attorney, Agent, or Firm* — Rabin & Berdo, P.C.

(57) ABSTRACT

A receiving apparatus that includes a first and second filter circuit. The first filter performs filtering on a frequency signal with a band-pass characteristic such that a frequency band of a desired channel is included in a passband, thereby obtaining a pass frequency signal. The second filter performs filtering on the pass frequency signal with a filter characteristic such that a frequency band of a channel adjoining the desired channel is included in an attenuation band.

16 Claims, 11 Drawing Sheets

FILTER CIRCUIT AND RECEIVING APPARATUS

BACKGROUND OF THE INVENTION

1. Field of the Invention

The present invention relates to a filter circuit that extracts a signal component corresponding to a desired channel from a frequency signal, and a receiving apparatus that includes the filter circuit.

2. Background Art

A superheterodyne receiving apparatus which once converts received radio waves into an intermediate frequency band signal is currently known. A problem with the use of the superheterodyne method is an image signal. To eliminate the image signal, a receiving apparatus using a complex band-pass filter as a filter in an intermediate frequency stage is known (for example, see Japanese Patent Application Laid-Open No. 2004-515104). A complex band-pass filter inputs intermediate frequency signals having a phase difference of 90° therebetween as a Q signal and an I signal, and passes desired waves and attenuates interfering waves with a desired band-pass characteristic.

For favorable reception performance, the complex band-pass filter desirably has a steep attenuation gradient with which to attenuate image waves or signals of unnecessary bands such as adjoining channels. To steepen the attenuation gradient, the filter order needs to be increased, with an increase in the circuit scale accordingly. Since the complex band-pass filter includes two systems of filters corresponding to the Q and I signals, respectively (for example see Japanese Patent Application Laid-Open No. 2008-205962), the amount of increase in the circuit scale due to the increased order is large.

SUMMARY OF THE INVENTION

An object of the present invention is to provide a filter circuit whose attenuation gradient can be steepened while suppressing an increase in the circuit scale, and a receiving apparatus that includes the filter circuit.

A filter circuit according to the present invention is a filter circuit for extracting a signal component corresponding to a desired channel from a frequency signal including signal components corresponding to a respective plurality of channels having respective different frequency bands, the filter circuit including a first filter that performs filtering on the frequency signal with a band-pass characteristic such that the frequency band of the desired channel is included in a passband, thereby obtaining a pass frequency signal, and a second filter that performs filtering on the pass frequency signal with a filter characteristic such that the frequency band of a channel adjoining the desired channel is included in an attenuation band, and outputs the signal component corresponding to the desired channel.

A receiving apparatus according to the present invention is a receiving apparatus including a mixer that mixes a high frequency signal with first and second local oscillation signals having a phase difference of 90° therebetween to generate first and second frequency signals, the high frequency signal being obtained by receiving a wireless broadcast wave including a plurality of channels having respective different frequency bands, and a filter circuit that extracts an intermediate frequency signal corresponding to a desired channel from the first and second frequency signals, the filter circuit including a complex band-pass filter that performs complex filtering on the first and second frequency signals with a band-pass characteristic such that the frequency band of the desired channel is included in a passband, thereby obtaining a pass frequency signal, and a real filter that performs filtering on the pass frequency signal with a filter characteristic such that the frequency band of a channel adjoining the desired channel is included in an attenuation band, and outputs the intermediate frequency signal.

DETAILED DESCRIPTION OF THE INVENTION

Figure 1:
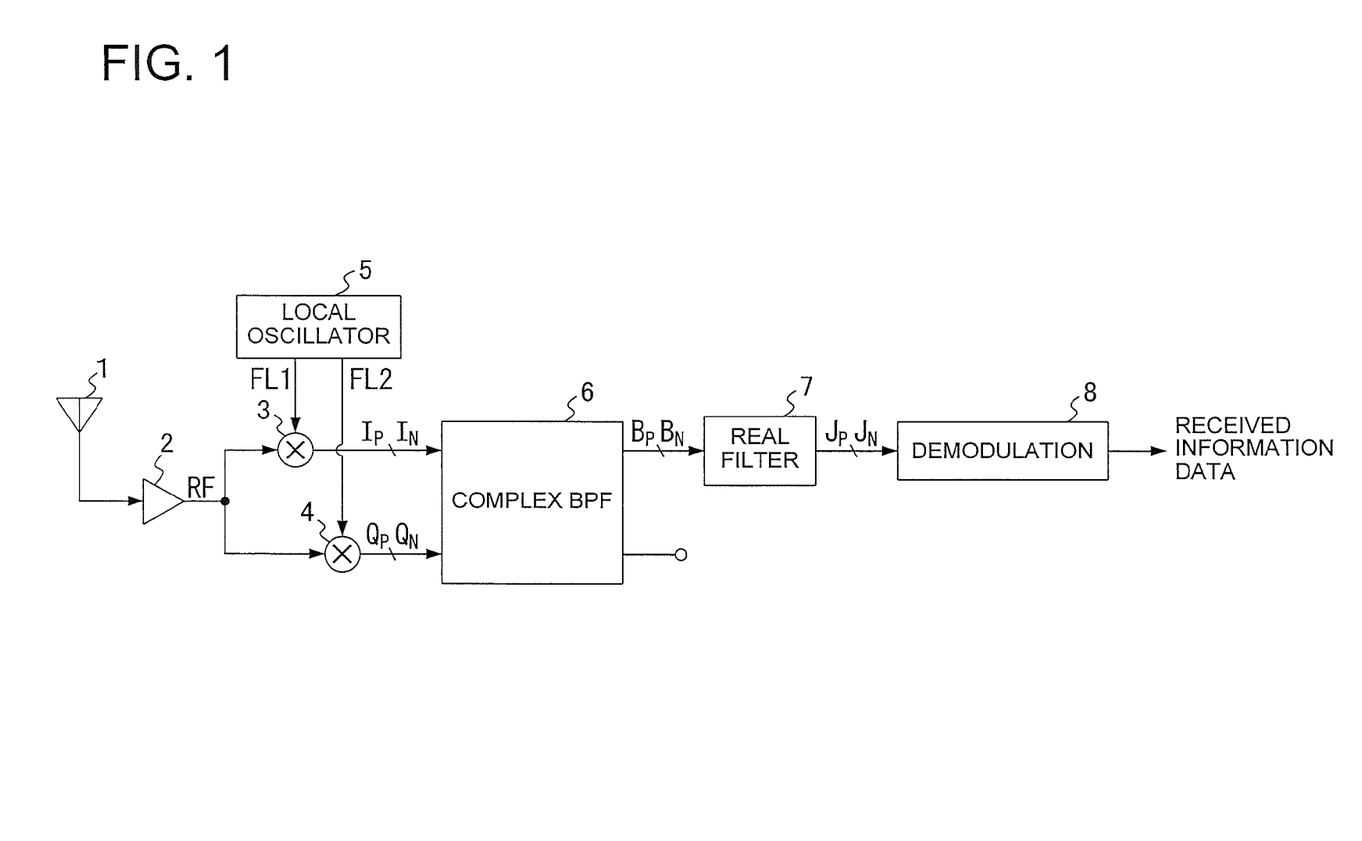
FIG. 1 is a block diagram showing a configuration of a receiving apparatus including a filter circuit according to the present invention.

FIG. 1 is a block diagram showing a configuration of a receiving apparatus including a filter circuit according to the present invention. As shown in FIG. 1, the receiving apparatus includes an antenna 1, a low noise amplifier 2, mixers 3 and 4, a local oscillator 5, a complex band-pass filter 6 (hereinafter, referred to as a complex BPF 6), a real filter 7, and a demodulation circuit 8.

In FIG. 1, the antenna 1 receives wireless broadcast waves including signal components corresponding to a respective plurality of channels having respective different frequency bands transmitted from a transmission apparatus (not shown). The antenna 1 supplies a high frequency signal obtained by receiving the wireless broadcast waves to the low noise amplifier 2. The low noise amplifier 2 supplies an amplified reception signal RF obtained by amplifying the high frequency signal to the mixers 3 and 4. The local oscillator 5 generates local oscillation signals FL1 and FL2 which have a frequency lower by an intermediate frequency fc than the frequency corresponding to a desired channel to be received and have a phase difference of 90° therebetween. The local oscillator 5 supplies the local oscillation signal FL1 to the mixer 3 and the local oscillation signal FL2 to the mixer 4.

The mixer 3 mixes the amplified reception signal RF with the local oscillation signal FL1 to generate intermediate frequency signals $I_P$ and $I_N$ which have a frequency lower than that of the above-described high frequency signal and have opposite polarities. The mixer 3 supplies the intermediate frequency signals $I_P$ and $I_N$ to the complex BPF 6. The mixer 4 mixes the amplified reception signal RF with the local oscillation signal FL2 to generate intermediate frequency signals $Q_P$ and $Q_N$. The intermediate frequency signal $Q_P$ has a phase 90° shifted from that of the above-described intermediate frequency signal $I_P$. The intermediate frequency signal $Q_N$ has a phase 90° shifted from that of the intermediate frequency signal $I_N$. The mixer 4 supplies the intermediate frequency signals $Q_P$ and $Q_N$ to the complex BPF 6. In other words, the mixers 3 and 4 supply the intermediate frequency signals ($I_P$, $I_N$) and ($Q_P$, $Q_N$) having a phase difference of 90° therebetween to the complex BPF 6.

Figure 2:
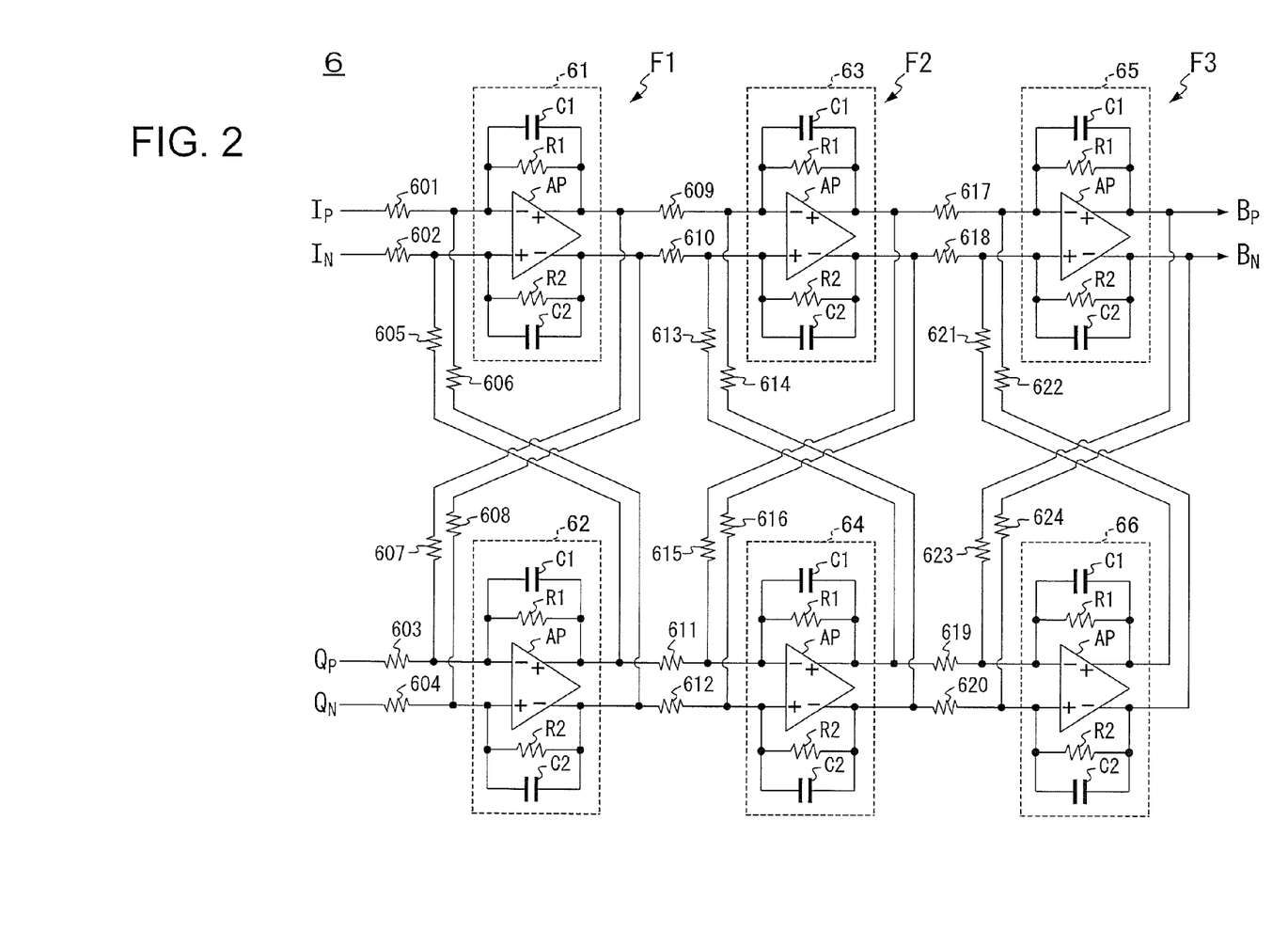
FIG. 2 is a circuit diagram showing an example of an internal configuration of a complex BPF 6.

For example, the complex BPF 6 is a Bessel band-pass filter having a circuit configuration such as shown in FIG. 2.

As shown in FIG. 2, the complex BPF 6 is a third-order filter including complex filters F1 to F3 connected in cascade. The complex filter F1 includes resistors 601 to 608 and unit filter modules 61 and 62. The complex filter F2 includes resistors 609 to 616 and unit filter modules 63 and 64. The complex filter F3 includes resistors 617 to 624 and unit filter modules 65 and 66.

The unit filter modules 61 to 66 are active filter modules having the same internal configuration, each including a differential-input differential-output operational amplifier AP, resistors R1 and R2, and capacitors C1 and C2. In each of the unit filter modules 61 to 66, the resistor R1 and the capacitor C1 are connected at one end to an inverting input terminal of the operational amplifier AP. The other ends of the resistor R1 and the capacitor C1 are connected to a non-inverting output terminal of the operational amplifier AP. The resistor R2 and the capacitor C2 are connected at one end to a non-inverting input terminal of the operational amplifier AP. The other ends of the resistor R2 and the capacitor C2 are connected to an inverting output terminal of the operational amplifier AP.

The intermediate frequency signals $I_P$ and $I_N$ are supplied from the mixer 3. The intermediate frequency signal $I_P$ is supplied to the inverting input terminal of the operational amplifier AP of the unit filter module 61 via the resistor 601. The intermediate frequency signal $I_N$ is supplied to the non-inverting input terminal of the operational amplifier AP of the unit filter module 61 via the resistor 602. The intermediate frequency signals $Q_P$ and $Q_N$ are supplied from the mixer 4. The intermediate frequency signal $Q_P$ is supplied to the inverting input terminal of the operational amplifier AP of the unit filter module 62 via the resistor 603. The intermediate frequency signal $Q_N$ is supplied to the non-inverting input terminal of the operational amplifier AP of the unit filter module 62 via the resistor 604. The non-inverting input terminal of the operational amplifier AP of the unit filter module 61 and the non-inverting output terminal of the operational amplifier AP of the unit filter module 62 are connected via the resistor 605. The inverting input terminal of the operational amplifier AP of the unit filter module 61 and the inverting output terminal of the operational amplifier AP of the unit filter module 62 are connected via the resistor 606. The inverting input terminal of the operational amplifier AP of the unit filter module 62 and the non-inverting output terminal of the operational amplifier AP of the unit filter module 61 are connected via the resistor 607. The non-inverting input terminal of the operational amplifier AP of the unit filter module 62 and the inverting output terminal of the operational amplifier AP of the unit filter module 61 are connected via the resistor 608.

The non-inverting output terminal of the operational amplifier AP of the unit filter module 61 is connected to the inverting input terminal of the operational amplifier AP of the unit filter module 63 via the resistor 609. The inverting output terminal of the operational amplifier AP of the unit filter module 61 is connected to the non-inverting input terminal of the operational amplifier AP of the unit filter module 63 via the resistor 610. The non-inverting output terminal of the operational amplifier AP of the unit filter module 62 is connected to the inverting input terminal of the operational amplifier AP of the unit filter module 62 via the resistor 611. The inverting output terminal of the operational amplifier AP of the unit filter module 62 is connected to the non-inverting input terminal of the operational amplifier AP of the unit filter module 64 via the resistor 612.

The non-inverting input terminal of the operational amplifier AP of the unit filter module 63 and the non-inverting output terminal of the operational amplifier AP of the unit filter module 64 are connected via the resistor 613. The inverting input terminal of the operational amplifier AP of the unit filter module 63 and the inverting output terminal of the operational amplifier AP of the unit filter module 64 are connected via the resistor 614. The inverting input terminal of the operational amplifier AP of the unit filter module 64 and the non-inverting output terminal of the operational amplifier AP of the unit filter module 63 are connected via the resistor 615. The non-inverting input terminal of the operational amplifier AP of the unit filter module 64 and the inverting output terminal of the operational amplifier AP of the unit filter module 63 are connected via the resistor 616.

The non-inverting output terminal of the operational amplifier AP of the unit filter module 63 is connected to the inverting input terminal of the operational amplifier AP of the unit filter module 65 via the resistor 617. The inverting output terminal of the operational amplifier AP of the unit filter module 63 is connected to the non-inverting input terminal of the operational amplifier AP of the unit filter module 65 via the resistor 618. The non-inverting output terminal of the operational amplifier AP of the unit filter module 64 is connected to the inverting input terminal of the operational amplifier AP of the unit filter module 66 via the resistor 619. The inverting output terminal of the operational amplifier AP of the unit filter module 64 is connected to the non-inverting input terminal of the operational amplifier AP of the unit filter module 66 via the resistor 620. The non-inverting input terminal of the operational amplifier AP of the unit filter module 65 and the non-inverting output terminal of the operational amplifier AP of the unit filter module 66 are connected via the resistor 621. The inverting input terminal of the operational amplifier AP of the unit filter module 65 and the inverting output terminal of the operational amplifier AP of the unit filter module 66 are connected via the resistor 622. The inverting input terminal of the operational amplifier AP of the unit filter module 66 and the non-inverting output terminal of the operational amplifier AP of the unit filter module 65 are connected via the resistor 623. The non-inverting input terminal of the operational amplifier AP of the unit filter module 66 and the inverting output terminal of the operational amplifier AP of the unit filter module 65 are connected via the resistor 624.

With such a configuration, the complex BPF 6 eliminates the signal components of unnecessary channels and image signals superposed on the intermediate frequency signals ($I_P$, $I_N$, $Q_P$, and $Q_N$) and extracts the signal of the band corresponding to the desired channel to be received from the intermediate frequency signals ($I_P$, $I_N$, $Q_P$, and $Q_N$). The complex BPF 6 transmits the extracted signal of the band corresponding to the desired channel to be received as an intermediate frequency signal $B_P$ from the non-inverting output terminal of the operational amplifier AP of the unit filter module 65. The complex BPF 6 transmits an intermediate frequency signal $B_N$ obtained by inverting the intermediate frequency signal $B_P$ in polarity from the inverting output terminal of the operational amplifier AP of the unit filter module 65.

Figure 3:
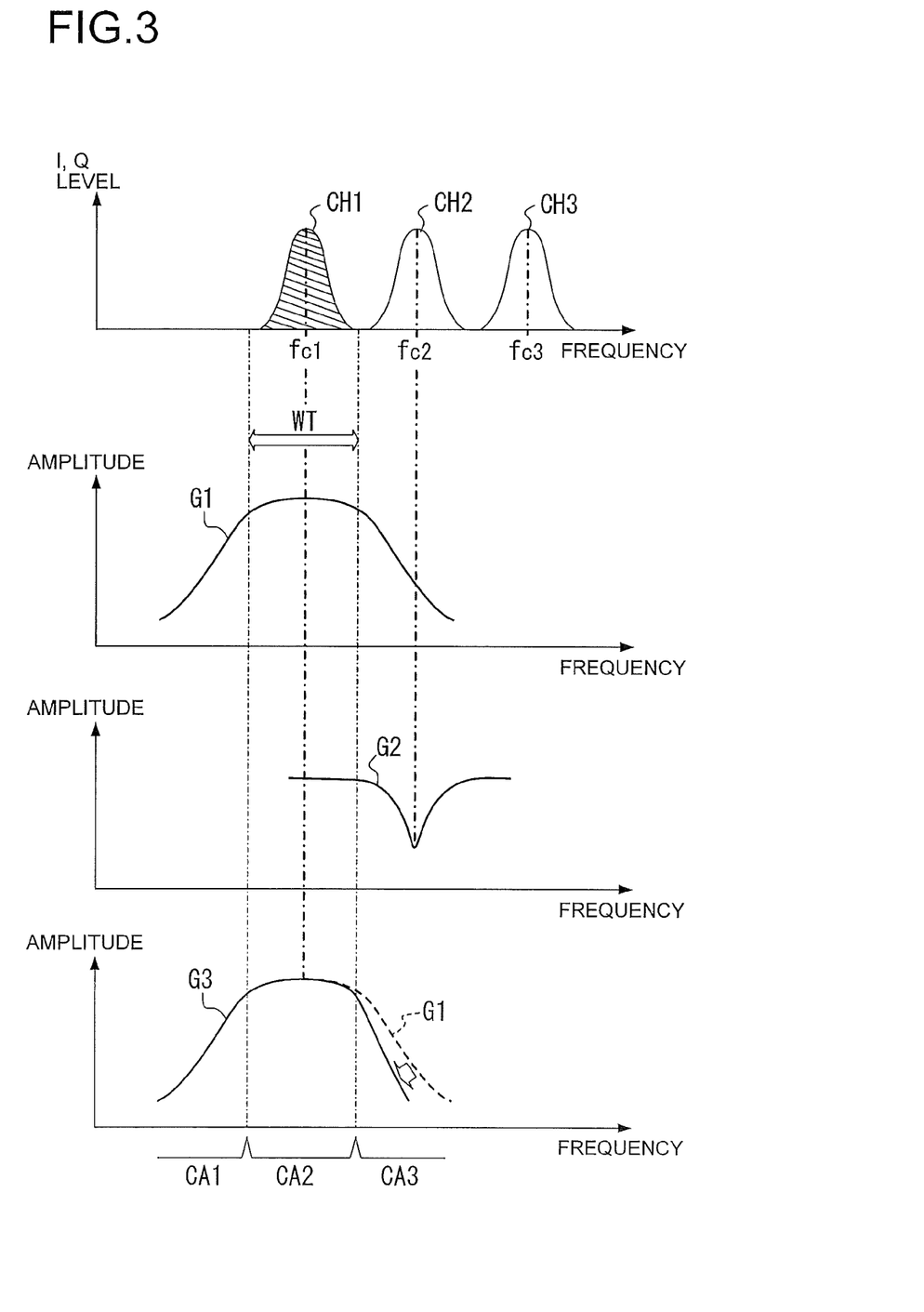
FIG. 3 is a diagram showing an example of filter characteristics of the complex BPF 6 and a real filter 7 (notch filter) and a filter characteristic as an intermediate frequency filter.

For example, as shown in FIG. 3, the intermediate frequency signals ($I_P$, $I_N$, $Q_P$, and $Q_N$) include a signal component corresponding to a desired channel CH1 to be received, and superposed signal components corresponding to channels CH2 and CH3 adjoining the channel CH1, respectively. As shown in FIG. 3, the complex BPF 6 has a filter characteristic G1 for passing a signal component across a bandwidth WT with a center frequency fc1 of the desired channel CH1 to be received at the center. To reduce group delay deviation in the desired channel CH1 to be received, the filter characteristic G1 of the complex BPF 6 may have a passband bandwidth WT greater than the frequency bandwidth of the desired channel CH1 to be received. If the bandwidth WT is set to be greater than the width of the desired channel CH1 to be received, such a bandwidth WT intrinsically causes noise and passes the signal of the adjoining channel CH2 to be eliminated.

The complex BPF 6 supplies pass frequency signals obtained by passing signal components of the intermediate frequency signals ($I_P$, $I_N$, $Q_P$, and $Q_N$) with the filter characteristic G1 to the real filter 7 at the next stage as the intermediate frequency signals $B_P$ and $B_N$.

Figure 4:
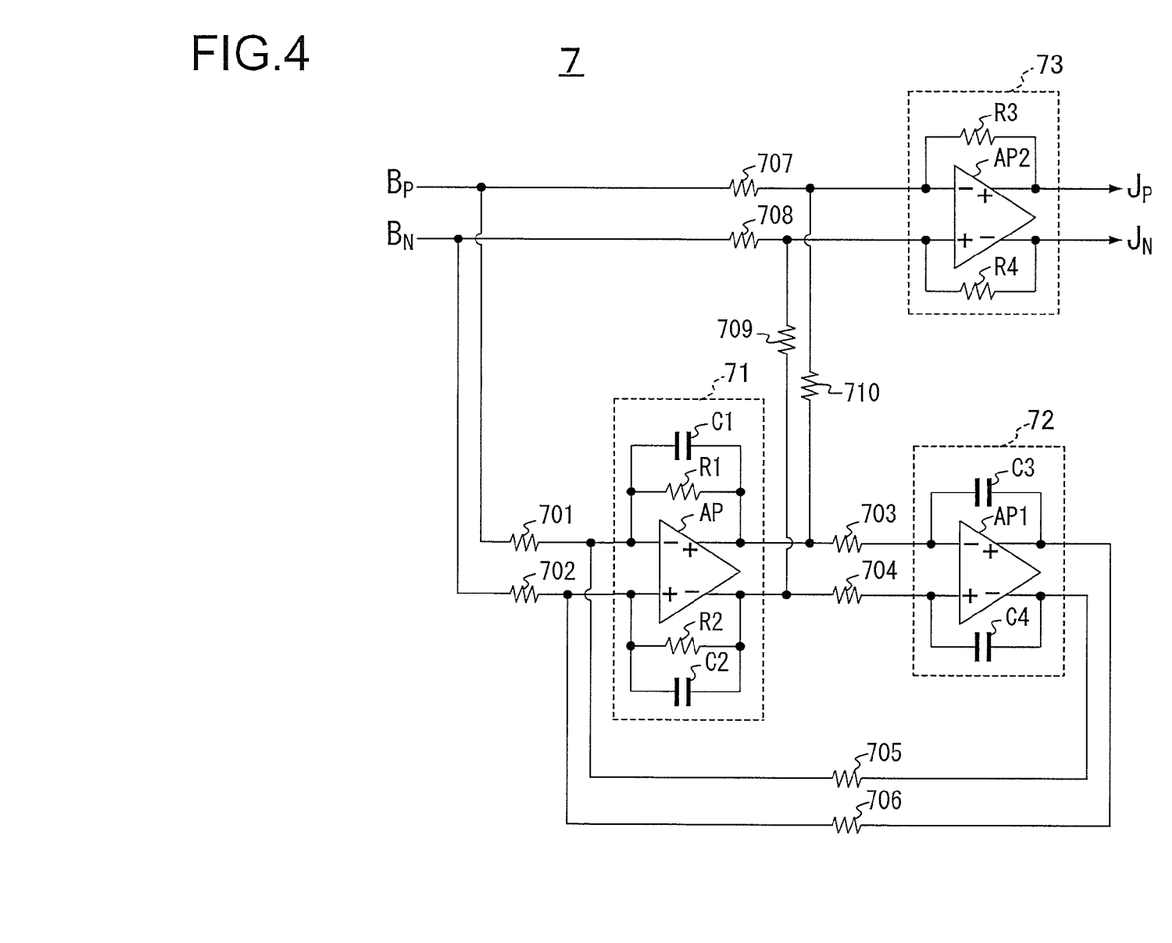
FIG. 4 is a circuit diagram showing an example of the configuration of the real filter 7 as a notch filter.

For example, the real filter 7 is a notch filter having a circuit configuration such as shown in FIG. 4.

As shown in FIG. 4, the real filter 7 serving as a notch filter includes unit filter modules 71 to 73 and resistors 701 to 710. The unit filter module 71 is an active filter module having the same internal circuit configuration as that of the unit filter modules 61 to 66. More specifically, the unit filter module 71 includes an operational amplifier AP, resistors R1 and R2, and capacitors C1 and C2. The unit filter module 72 includes an operational amplifier AP1 and capacitors C3 and C4. The capacitor C3 is connected across an inverting input terminal and a non-inverting output terminal of the operational amplifier AP1. The capacitor C4 is connected across a non-inverting input terminal and an inverting output terminal of the operational amplifier AP1. The unit filter module 73 includes an operational amplifier AP2 and resistors R3 and R4. The resistor R3 is connected across an inverting input terminal and a non-inverting output terminal of the operational amplifier AP2. The resistor R4 is connected across a non-inverting input terminal and an inverting output terminal of the operational amplifier AP2. The operational amplifiers AP, AP1, and AP2 included in the respective unit filter modules 71 to 73 constituting the real filter 7 have a higher bias current and operate at higher speed than the operational amplifiers AP included in the respective unit filter modules 61 to 66 constituting the complex BPF 6. The operational amplifiers AP included in the complex BPF 6 operate with a lower bias current and at lower speed than the operational amplifiers AP, AP1, and AP2 included in the real filter 7. The operational amplifiers included in the real filter 7 handle faster signals than the operation amplifiers included in the complex BPF 6. The resistors and capacitors included in the real filter 7 have a time constant smaller than that of the resistors and capacitors included in the complex BPF 6. The real filter 7 uses resistors and capacitors having relatively small formation areas for the sake of a small time constant as compared to the complex BPF 6.

The intermediate frequency signal $B_P$ and $B_N$ are supplied from the complex BPF 6. The intermediate frequency signal $B_P$ is supplied to the inverting input terminal of the operational amplifier AP of the unit filter module 71 via the resistor 701. The intermediate frequency signal $B_P$ is also supplied to the inverting input terminal of the operational amplifier AP2 of the unit filter module 73 via the resistor 707. The intermediate frequency signal $B_N$ is supplied to the non-inverting input terminal of the operational amplifier AP of the unit filter module 71 via the resistor 702. The intermediate frequency signal $B_N$ is also supplied to the non-inverting input terminal of the operational amplifier AP2 of the unit filter module 73 via the resistor 708. The non-inverting output terminal of the operational amplifier AP of the unit filter module 71 is connected to the inverting input terminal of the operational amplifier AP1 of the unit filter module 72 via the resistor 703. The non-inverting output terminal of the operational amplifier AP is also connected to the inverting input terminal of the operational amplifier AP2 of the unit filter module 73 via the resistor 710. The inverting output terminal of the operational amplifier AP of the unit filter module 71 is connected to the non-inverting input terminal of the operational amplifier AP1 of the unit filter module 72. The inverting output terminal of the operational amplifier AP is also connected to the non-inverting input terminal of the operational amplifier AP2 of the unit filter module 73 via the resistor 709. The inverting output terminal of the operational amplifier AP1 of the unit filter module 72 and the inverting input terminal of the operational amplifier AP of the unit filter module 71 are connected via the resistor 705. The non-inverting output terminal of the operational amplifier AP1 of the unit filter module 72 and the non-inverting input terminal of the operational amplifier AP of the unit filter module 71 are connected via the resistor 706.

With such a configuration, the real filter 7 performs filtering on the intermediate frequency signals ($B_P$ and $B_N$) supplied from the complex BPF 6 at the previous stage with a filter characteristic G2 such as shown in FIG. 3. The filter characteristic G2 provides a maximum attenuation of, for example, 10 dB at a center frequency fc2 of the channel CH2 adjoining the desired channel CH1 to be received (on the high frequency side). The real filter 7 may perform filtering on the intermediate frequency signals ($B_P$ and $B_N$) with a filter characteristic that provides a maximum attenuation at a center frequency fc3 of the channel CH3 adjoining the channel CH2 further on the high frequency side. The real filter 7 transmits an intermediate frequency signal $J_P$ obtained by such filtering from the non-inverting output terminal of the operational amplifier AP2 of the unit filter module 73. The real filter 7 transmits an intermediate frequency signal $J_N$ obtained by inverting the intermediate frequency signal $J_P$ in polarity from the inverting output terminal of the operational amplifier AP2 of the unit filter module 73.

The complex BPF 6 and the real filter 7 are connected in series to form an intermediate frequency filter. The intermediate frequency filter performs filtering on the intermediate frequency signals ($I_P$, $I_N$, $Q_P$, and $Q_N$) supplied from the mixers (3 and 4) with a filter characteristic G3 such as shown in FIG. 3. The filter characteristic G3 combines the filter characteristic G1 of the complex BPF 6 and the filter characteristic G2 of the real filter 7. As shown in FIG. 3, the characteristics of the filter characteristic G3 in a low frequency side attenuation band CA1 and a passband CA2 are equivalent to those of the filter characteristic G1 in the low frequency side attenuation band CA1 and the passband CA2. With the provision of the real filter 7, as shown in FIG. 3, the attenuation gradient of the filter characteristic G3 in a high frequency side attenuation band CA3 becomes steeper than that of the filter characteristic G1 in the high frequency side attenuation band CA3. This can reliably eliminate interference from the channel CH2 adjoining the desired channel CH1 to be received on the high frequency side.

The intermediate frequency filter including the complex BPF 6 and the real filter 7 supplies the intermediate frequency signals $J_P$ and $J_N$ obtained by the above-described filtering to the demodulation circuit 8.

The demodulation circuit 8 demodulates the intermediate frequency signals $J_P$ and $J_N$ to restore the wireless-transmitted information data.

In such a manner, the receiving apparatus shown in FIG. 1 converts the transmitted high frequency signal into an intermediate frequency signal having a frequency lower than that of the high frequency signal and performs demodulation processing. In that process, the receiving apparatus extracts only the signal component of the desired channel to be received by using the intermediate frequency filter formed by connecting the two-input two-output complex BPF 6 and the one-input one-output real filter 7 in cascade.

The intermediate frequency filter uses a Bessel filter as the complex BPF 6. The complex BPF 6 can thus eliminate image signals and reduce group delay deviation in the passband. In order for the complex BPF 6 to reliably suppress interference from the channel CH2 adjoining the desired channel CH1 to be received as shown in FIG. 3, the amount of attenuation in the stopbands of the filter needs to be increased. In other words, the attenuation gradient needs to be steepened. The attenuation gradient can be steepened by increasing the filter order. As shown in FIG. 2, the complex BPF 6 needs two unit filter modules (for example, 61 and 62) for each filter stage. This means a large amount of increase in the circuit scale as the filter order increases. For example, for the complex BPF 6 to provide the filter characteristic G3 shown in FIG. 3 by itself, two stages of complex filters need to be added subsequent to the three stages of complex filters F1 to F3 such as shown in FIG. 2. Consequently, the circuit scale increases at least as much as four unit filter modules (including four operational amplifiers AP, as well as resistors and capacitors connected to the respective operational amplifiers AP) for constituting the additional two stages of complex filters.

To suppress such an increase in the circuit scale, the real filter 7 having the filter characteristic G2 is connected to the subsequent stage of the complex BPF 6. As shown in FIG. 3, the filter characteristic G2 provides a maximum attenuation at the center frequency fc2 (or fc3) of the channel CH2 (or CH3) adjoining the desired channel CH1 to be received. As a result, the desired filter characteristic, i.e., the filter characteristic G3 having a steeper attenuation gradient than that of the filter characteristic C1 of the complex BPF 6 in the high frequency side attenuation band CA3 can be obtained without increasing the order of the complex BPF 6. As shown in FIG. 4, the real filter 7 serving as a notch filter includes three operational amplifiers (AP, AP1, and AP2) and elements (resistors and capacitors) connected to the respective operational amplifiers. The configuration that the real filter 7 is connected to the subsequent stage of the complex BPF 6 makes the amount of increase in the circuit scale smaller than when the filter order of the complex BPF 6 is increased.

Since the intermediate frequency filter includes the complex BPF 6 and the real filter 7, the Bessel complex BPF 6 can reduce the group delay deviation in the passband CA2. The real filter 7 can steepen the attenuation gradient in the high frequency side attenuation band CA3. With such an intermediate frequency filter (6 and 7), the frequency characteristic in the passband and the attenuation gradient in the attenuation band can be set separately. This facilitates widening the passband, reducing the group delay deviation, and increasing the amount of attenuation in the attenuation band.

According to the present invention, an intermediate frequency filter having a small group delay deviation and a steep attenuation gradient can be achieved with a small scale circuit configuration.

In the foregoing embodiment, a notch filter is used as the real filter 7. A low-pass filter may be used instead of the notch filter.

Figure 5:
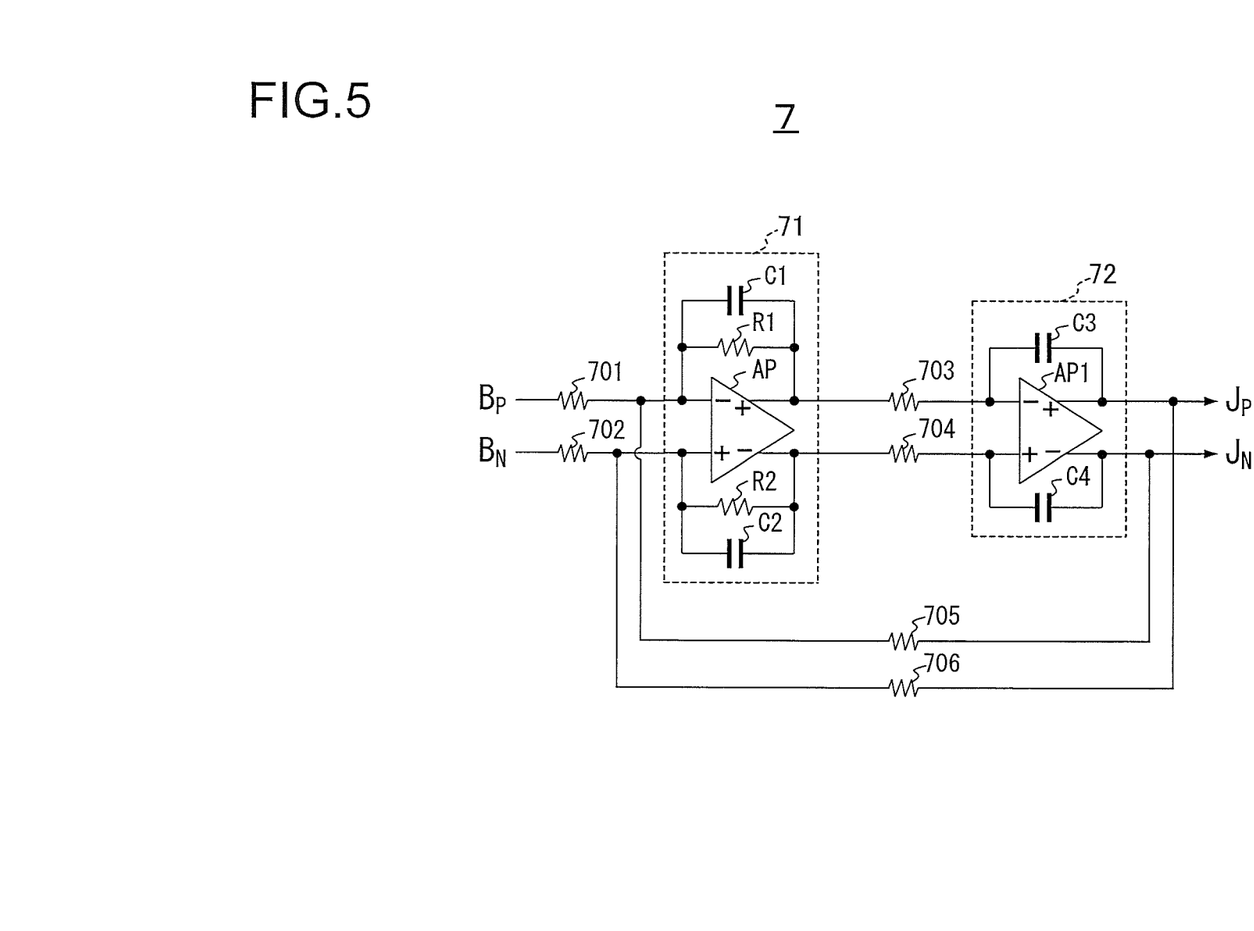
FIG. 5 is a circuit diagram showing an example of the configuration of the real filter 7 as a low-pass filter.

FIG. 5 is a circuit diagram showing an example of the internal configuration of the real filter 7 when the real filter 7 is configured as a low-pass filter.

The configuration shown in FIG. 5 is obtained by omitting the resistors 707 to 710 and the unit filter module 73 from the notch filter shown in FIG. 4. The rest of the circuit configuration is the same as shown in FIG. 4. In the configuration shown in FIG. 5, the intermediate frequency signal $J_P$ is transmitted from the non-inverting output terminal of the operational amplifier AP1 of the unit filter module 72. The intermediate frequency signal $J_N$ is transmitted from the inverting output terminal of the operational amplifier AP1 of the unit filter module 72.

Figure 6:
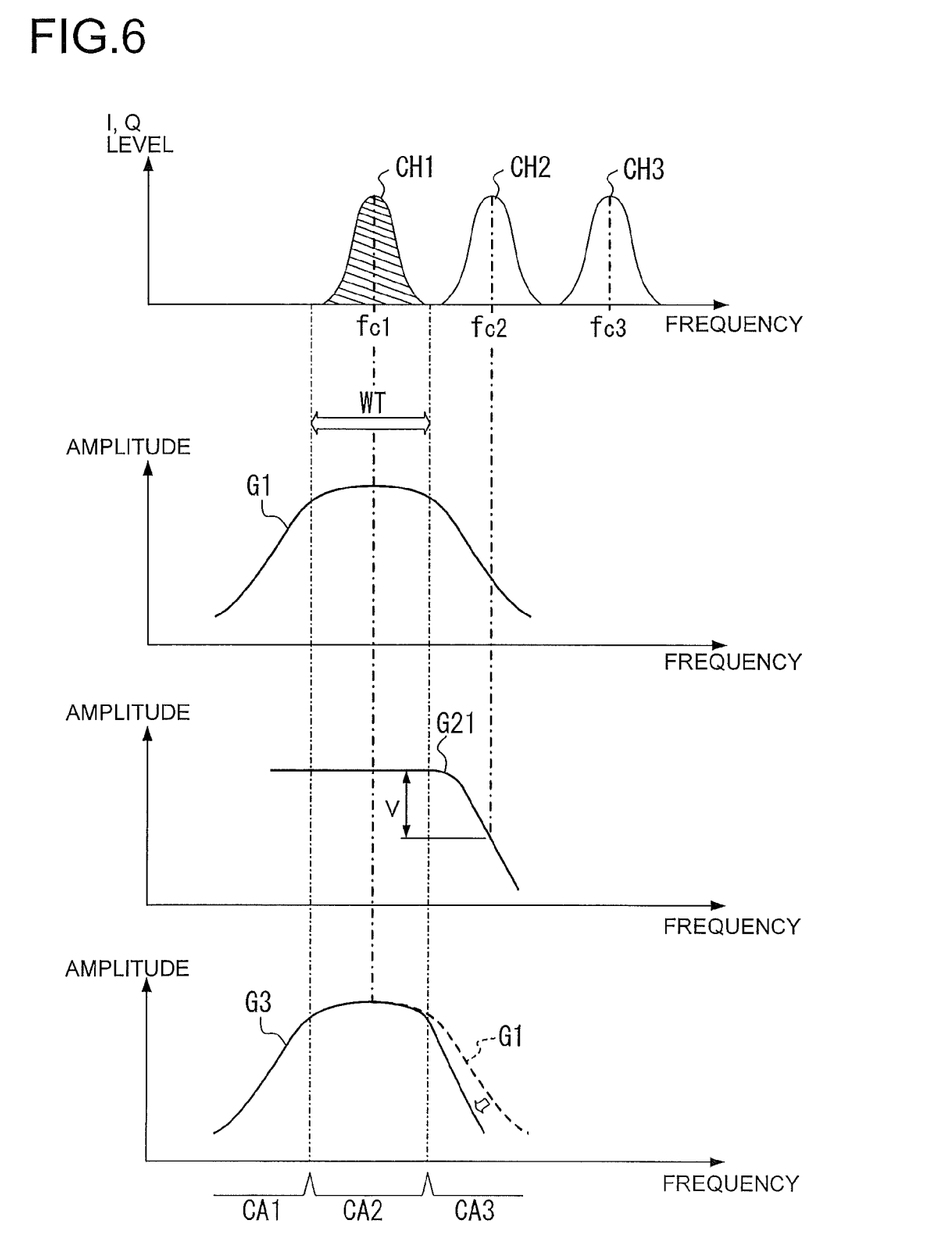
FIG. 6 is a diagram showing an example of the filter characteristics of the complex BPF 6 and the real filter 7 (low-pass filter) and the filter characteristic as an intermediate frequency filter.

As shown in FIG. 6, the real filter 7 serving as a low-pass filter has a filter characteristic G21 that provides a predetermined amount of attenuation V (for example, 10 dB) at the center frequency fc2 of the channel CH2 adjoining the desired channel CH1 to be received. In other words, the real filter 7 has a filter characteristic G21 such that its cutoff frequency falls within an attenuation band of the complex BPF 6. The real filter 7 may have a filter characteristic that provides a predetermined amount of attenuation V at the center frequency fc3 of the channel CH3 which adjoins the high frequency side of the channel CH2 adjoining the desired channel CH1 to be received. The internal frequency filter including the complex BPF 6 and the real filter 7 performs filtering on the intermediate frequency signals ($I_P$, $I_N$, $Q_P$, and $Q_N$) supplied from the mixers (3 and 4) with a filter characteristic G3 such as shown in FIG. 6. The filter characteristic G3 is a combined filter characteristic of the filter characteristic G1 of the complex BPF 6 and the filter characteristic G21 of the real filter 7. As shown in FIG. 6, the characteristics of the filter characteristic G3 in the low frequency side attenuation band CA1 and the passband CA2 are equivalent to those of the filter characteristic G1 of the complex BPF 6 in the low frequency side attenuation band CA1 and the passband CA2. With the provision of the real filter 7, as shown in FIG. 6, the attenuation gradient of the filter characteristic G3 in the high frequency side attenuation band CA3 becomes steeper than that of the filter characteristic G1 in the high frequency side attenuation band CA3. This can reliably eliminate interference from the channel CH2 adjoining the desired channel CH1 to be received on the high frequency side. As shown in FIG. 5, the real filter 7 serving as a low-pass filter includes two operational amplifiers (AP and AP1) and elements (resistors and capacitors) connected to the respective operational amplifiers.

If a low-pass filter such as shown in FIG. 5 is used as the real filter 7, the circuit scale can be reduced as compared to when a notch filter such as shown in FIG. 4 is used.

A band-pass filter may be used as the real filter 7, instead of a notch filter or a low-pass filter.

Figure 7:
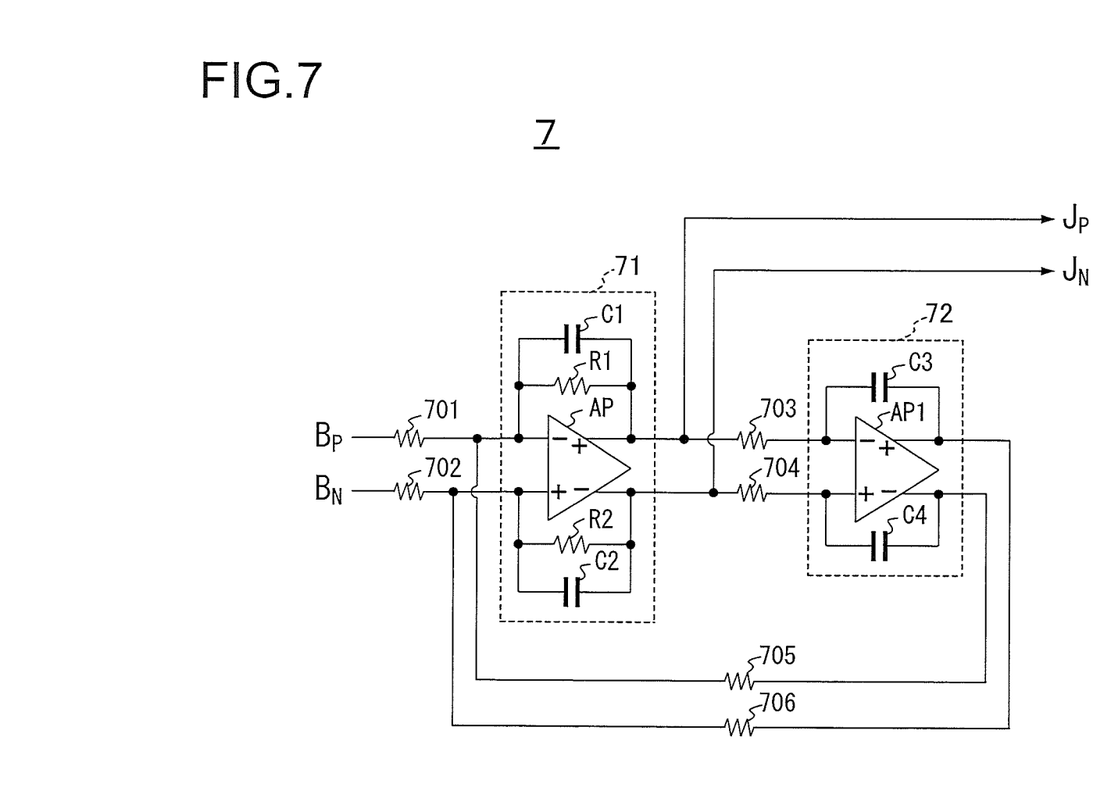
FIG. 7 is a circuit diagram showing an example of the configuration of the real filter 7 as a band-pass filter.

FIG. 7 is a circuit diagram showing another example of the internal configuration of the real filter 7 when the real filter 7 is configured as a band-pass filter.

The configuration shown in FIG. 7 is obtained by diverting the circuitry of the low-pass filter shown in FIG. 5. When the real filter 7 is used as a band-pass filter, as shown in FIG. 7, the intermediate frequency signal $J_P$ is transmitted from the non-inverting output terminal of the operational amplifier AP of the unit filter module 71. The intermediate frequency signal $J_N$ is transmitted from the inverting output terminal of the operational amplifier AP.

Figure 8:
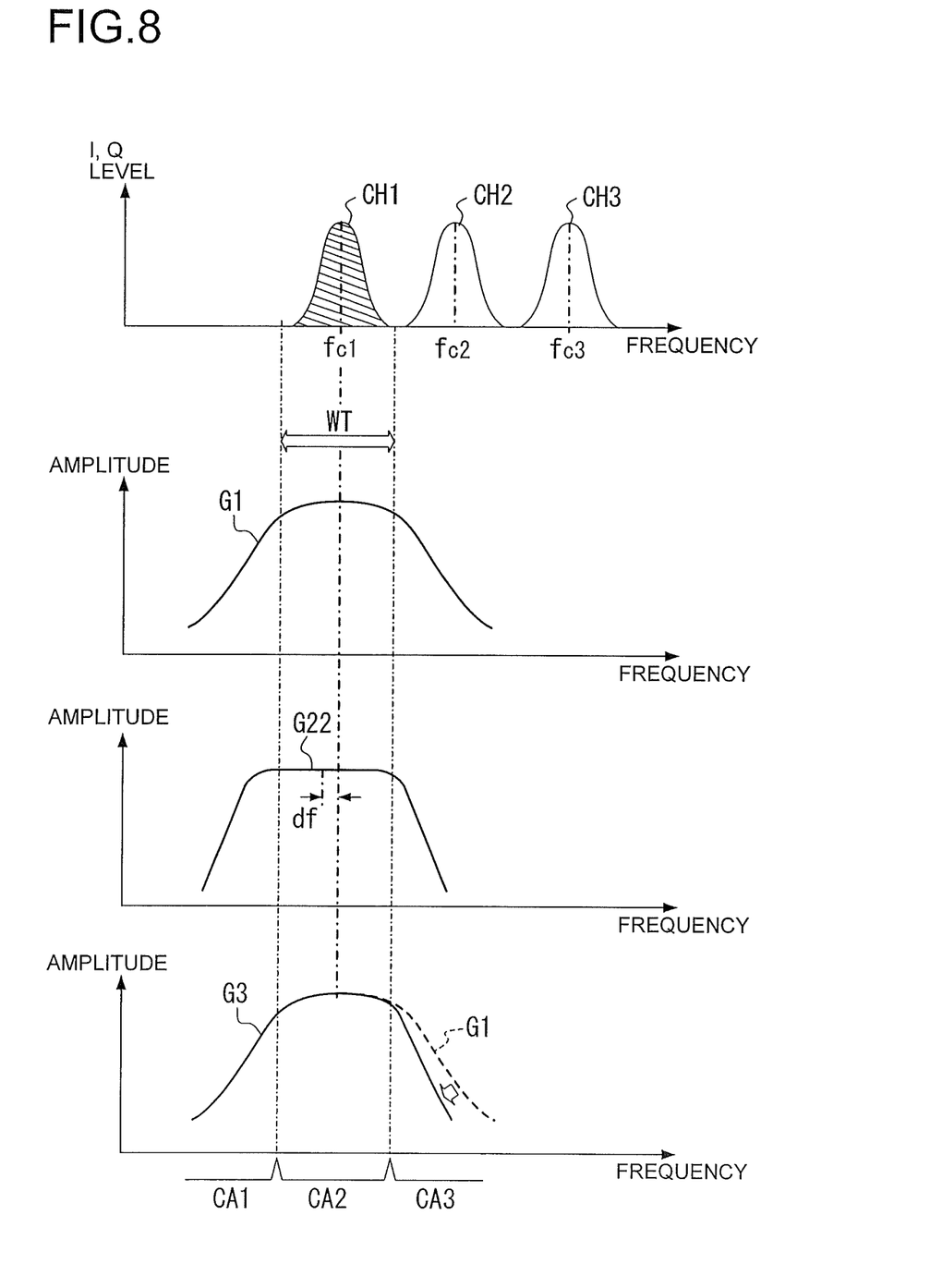
FIG. 8 is a diagram showing an example of the filter characteristics of the complex BPF 6 and the real filter 7 (band-pass filter) and the filter characteristic as an intermediate frequency filter.

As shown FIG. 8, the real filter 7 serving as a band-pass filter has a filter characteristic G22. The filter characteristic G22 passes a signal component across a bandwidth WT with a frequency obtained by shifting the center frequency fc1 of the desired channel CH1 to be received to lower frequencies by a frequency df at the center. The intermediate frequency filter including the complex BPF 6 and the real filter 7 performs filtering on the intermediate frequency signals ($I_P$, $I_N$, $Q_P$, and $Q_N$) supplied from the mixers (3 and 4) with a filter characteristic G3 such as shown in FIG. 8. The filter characteristic G3 is a combined filter characteristic of the filter characteristic G1 of the complex BPF 6 and the filter characteristic G22 of the real filter 7. As shown in FIG. 8, the characteristics of the filter characteristic G3 in the low frequency side attenuation band CA1 and the passband CA2 are equivalent to those of the filter characteristic C1 of the complex BPF 6 in the low frequency side attenuation band CA1 and the passband CA2. With the provision of the real filter 7, as shown in FIG. 8, the attenuation gradient of the filter characteristic G3 in the high frequency side attenuation band CA3 becomes steeper than that of the filter characteristic G1 in the high frequency side attenuation band CA3. This can reliably eliminate interference from the channel CH2 adjoining the desired channel CH1 to be received on the high frequency side. As shown in FIG. 7, the real filter 7 serving as a band-pass filter includes two operational amplifiers (AP and AP1) and elements (resistors and capacitors) connected to the respective operational amplifiers.

If a band-pass filter such as shown in FIG. 7 is used as the real filter 7, the circuit scale can be reduced, again, as compared to when a notch filter such as shown in FIG. 4 is used. When a band-pass filter is used as the real filter 7, the attenuation gradient of the intermediate frequency filter in the low frequency side attenuation band CA1 is set by the complex BPF 6. The attenuation gradient in the high frequency side attenuation band CA3 is set by the real filter 7. Since the attenuation gradients on the low and high frequency sides can be set separately, an intermediate frequency filter having a passband and attenuation gradients corresponding to various modulation methods and communication speeds can be easily obtained.

The intermediate frequency filter according to the foregoing embodiment uses the real filter 7 to steepen the attenuation gradient in the high frequency side attenuation band CA3 so that interference waves from a channel adjoining the desired channel CH1 to receive on the high frequency side are eliminated by priority. If there is a channel on the low frequency side of the desired channel CH1 to be received, the real filter 7 can be used to steepen the attenuation gradient in the low frequency side attenuation band CA1 so that interference waves from the channel are eliminated by priority.

Figure 9:
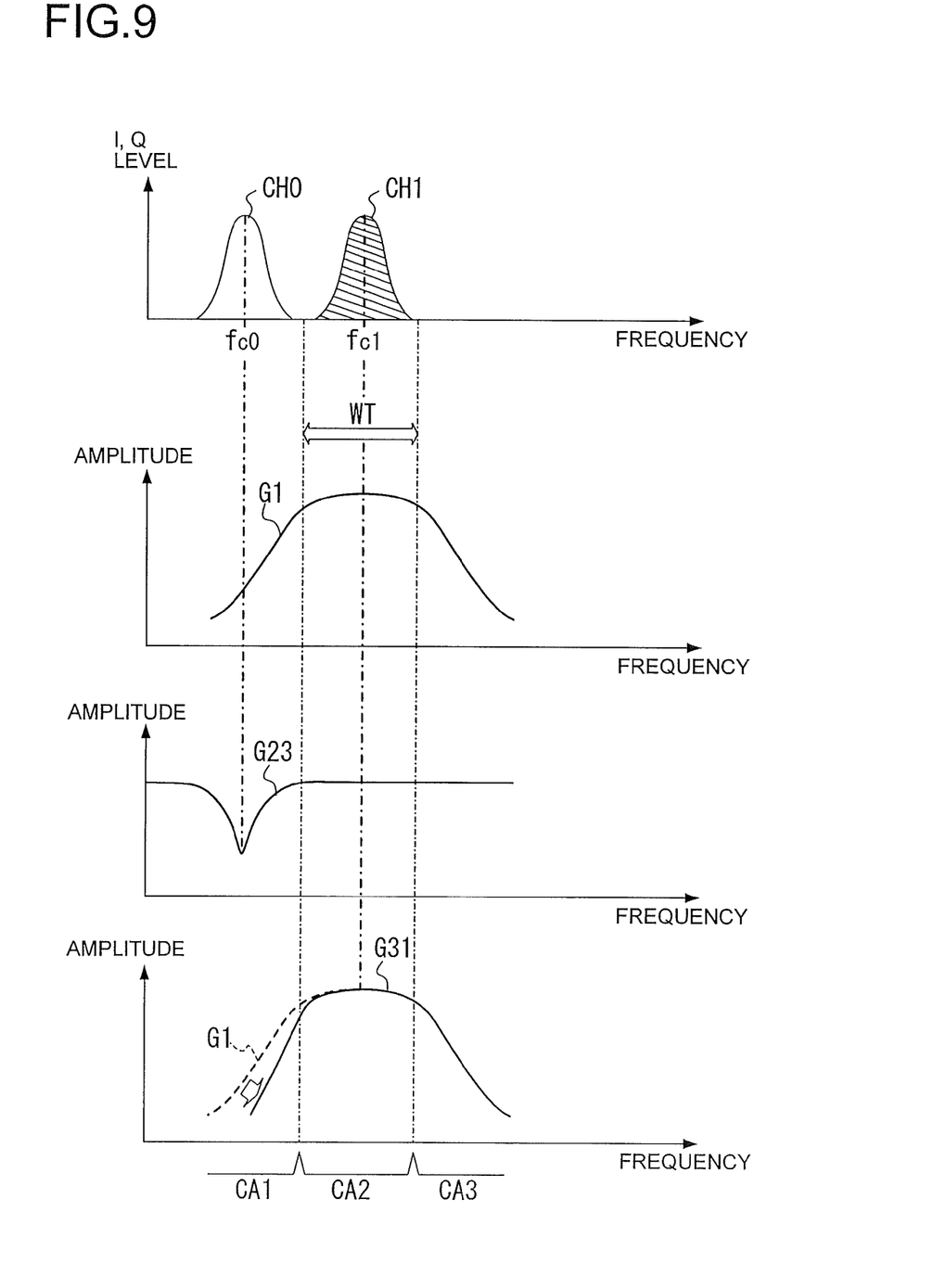
FIG. 9 is a diagram showing another example of the filter characteristics of the complex BPF 6 and the real filter 7 (notch filter) and the filter characteristic as an intermediate frequency filter.

For example, the real filter 7 may be a notch filter that performs filtering on the intermediate frequency signals ($B_P$ and $B_N$) supplied from the complex BPF 6 at the prior stage with a filter characteristic G23 such as shown in FIG. 9. The filter characteristic G23 provides a maximum attenuation at the center frequency fc0 of a channel CH0 adjoining the desired channel CH1 to be received on the low frequency side. The intermediate frequency filter including the complex BPF 6 and the real filter 7 performs filtering on the intermediate frequency signals ($I_P$, $I_N$, $Q_P$, and $Q_N$) supplied from the mixers (3 and 4) with a filter characteristic G31 such as shown in FIG. 9. The filter characteristic G31 is a combined filter characteristic of the filter characteristic G1 of the complex BPF 6 and the filter characteristic G23 of the real filter 7. As shown in FIG. 9, the characteristics of the filter characteristic G31 in the passband CA2 and the high frequency side attenuation band CA3 are equivalent to those of the filter characteristic G1 of the complex BPF 6 in the passband CA2 and the high frequency side attenuation band CA3. With the provision of the real filter 7, as shown in FIG. 9, the attenuation gradient of the filter characteristic G31 in the low frequency side attenuation band CA1 becomes steeper than that of the filter characteristic G1 in the low frequency side attenuation band CA1. This can reliably eliminate interference from the channel CH0 adjoining the desired channel CH1 to be received on the low frequency side.

Figure 10:
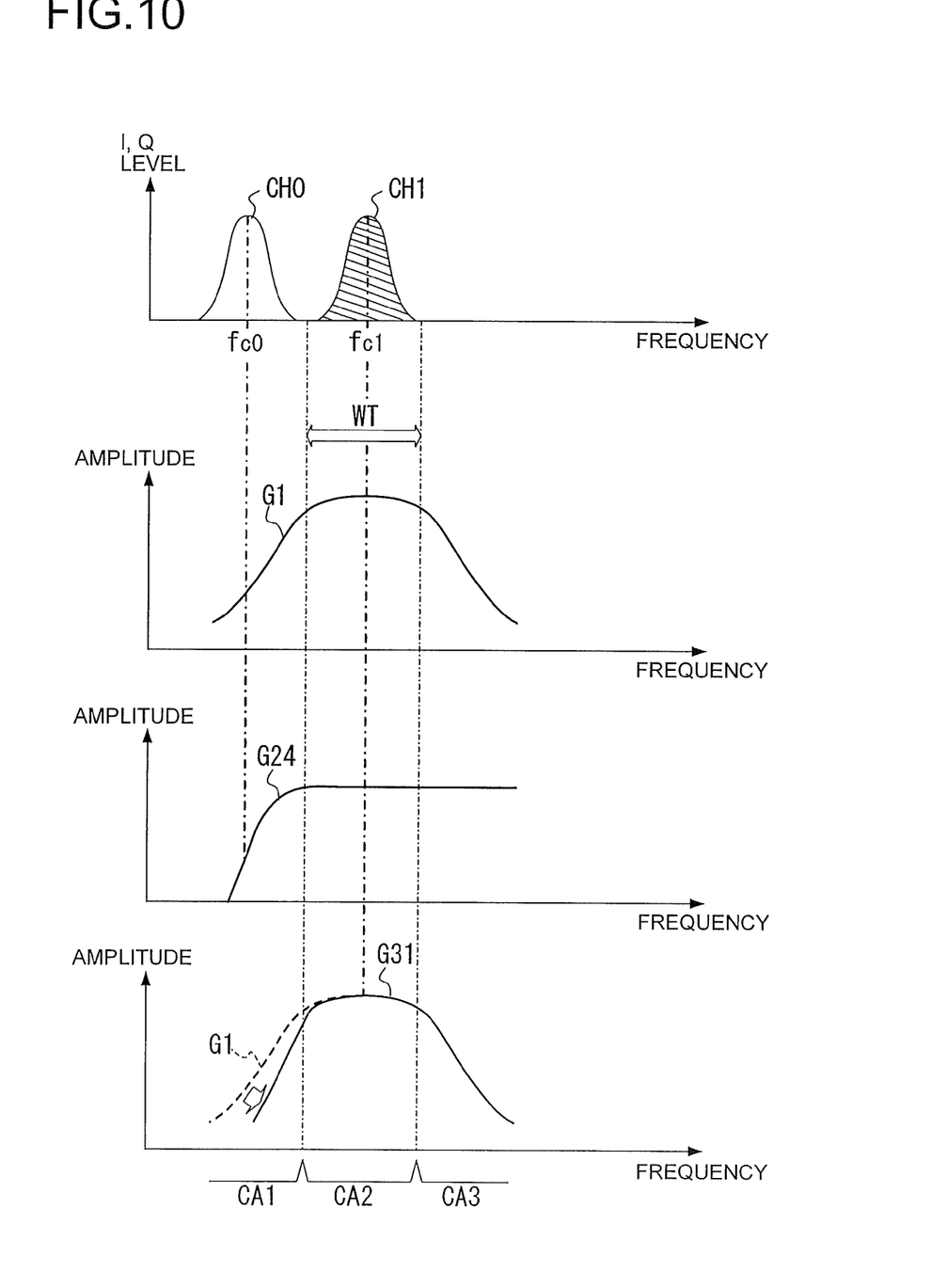
FIG. 10 is a diagram showing another example of the filter characteristics of the complex BPF 6 and the real filter 7 (high-pass filter) and the filter characteristic as an intermediate frequency filter.

For example, the real filter 7 may be a high-pass filter having a filter characteristic G24 such as shown in FIG. 10. The filter characteristic G24 provides a predetermined amount of attenuation at the center frequency fc0 of the channel CH0 adjoining the desired channel CH1 to be received on the low frequency side. In other words, the real filter 7 serving as a high-pass filter has a filter characteristic G24 such that its cutoff frequency falls within an attenuation range of the complex BPF 6. The intermediate frequency filter including the complex BPF 6 and the real filter 7 performs filtering on the intermediate frequency signals ($I_P$, $I_N$, $Q_P$, and $Q_N$) supplied from the mixers (3 and 4) with a filter characteristic G31 such as shown in FIG. 10. The filter characteristic G31 is a combined filter characteristic of the filter characteristic G1 of the complex BPF 6 and the filter characteristic G24 of the real filter 7. As shown in FIG. 10, the characteristics of the filter characteristic G31 in the passband CA2 and the high frequency side attenuation band CA3 are equivalent to those of the filter characteristic G1 of the complex BPF 6 in the passband CA2 and the high frequency side attenuation band CA3. With the provision of the real filter 7, as shown in FIG. 10, the attenuation gradient of the filter characteristic G31 in the low frequency side attenuation band CA1 becomes steeper than that of the filter characteristic G1 in the low frequency side attenuation band CA1. This can reliably eliminate interference from the channel CH0 adjoining the desired channel CH1 to be received on the low frequency side.

Figure 11:
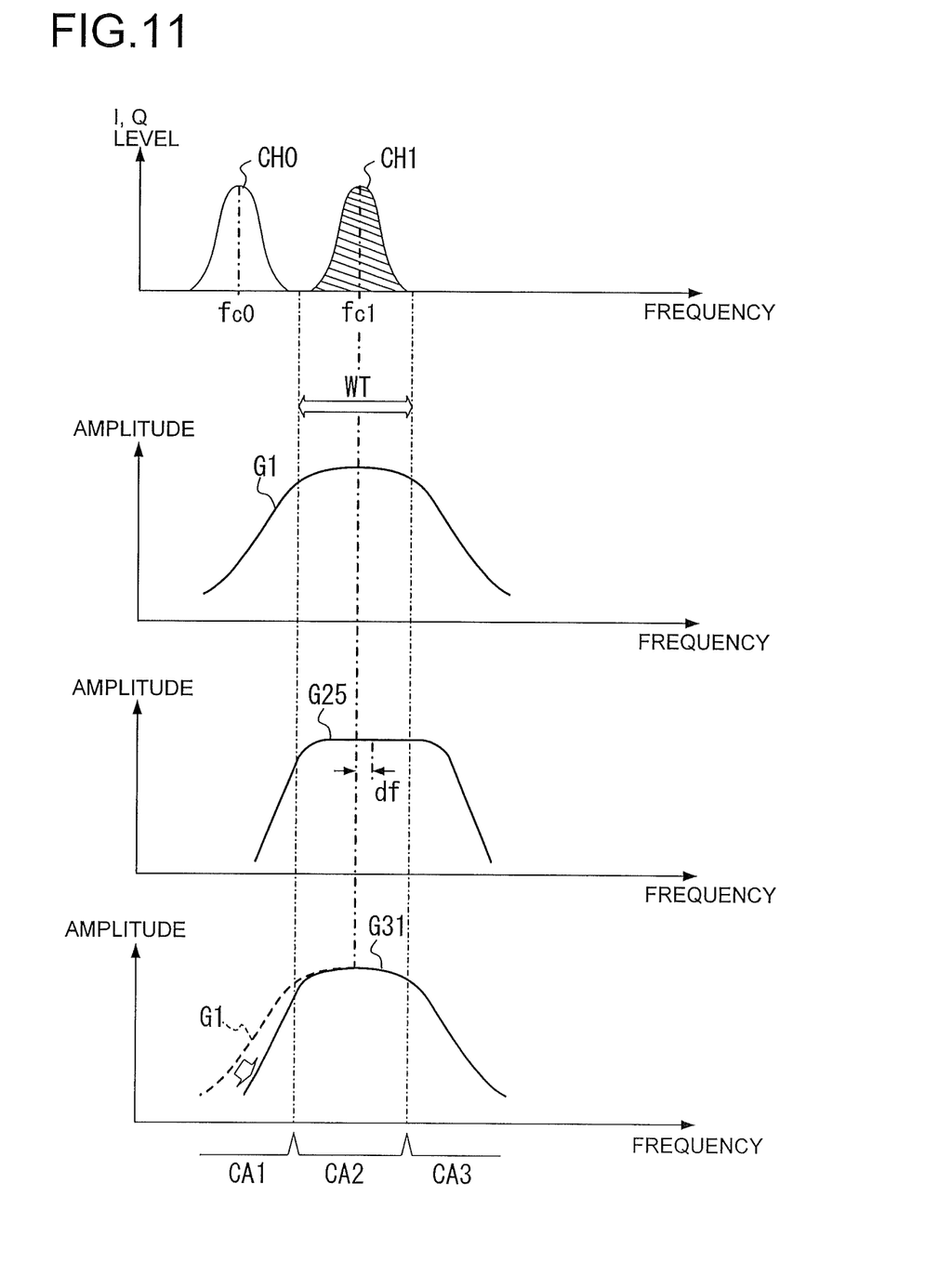
FIG. 11 is a diagram showing another example of the filter characteristics of the complex BPF 6 and the real filter 7 (band-pass filter) and the filter characteristic as an intermediate frequency filter.

For example, the real filter 7 may be a band-pass filter having a filter characteristic G25 such as shown in FIG. 11. The filter characteristic G25 passes a signal component across a bandwidth WT with a frequency obtained by shifting the center frequency fc1 of the desired channel CH1 to be received to higher frequencies by a frequency df at the center. The intermediate frequency filter including the complex BPF 6 and the real filter 7 performs filtering on the intermediate frequency signals ($I_P$, $I_N$, $Q_P$, and $Q_N$) supplied from the mixers (3 and 4) with a filter characteristic G31 such as shown in FIG. 11. The filter characteristic G31 combines the filter characteristic G1 of the complex BPF 6 and the filter characteristic G25 of the real filter 7. As shown in FIG. 11, the characteristics of the filter characteristic G31 in the passband CA2 and the high frequency side attenuation band CA3 are equivalent to those of the filter characteristic G1 of the complex BPF 6 in the passband CA2 and the high frequency side attenuation band CA3. With the provision of the real filter 7, as shown in FIG. 11, the attenuation gradient of the filter characteristic G31 in the low frequency side attenuation band CA1 becomes steeper than that of the filter characteristic G1 in the low frequency side attenuation band CA1. This can reliably eliminate interference from the channel CH0 adjoining the desired channel CH1 to be received on the low frequency side.

In the foregoing embodiment, differential-output operational amplifiers are used as the operational amplifiers (AP, AP1, and AP2). The operational amplifiers used in either one or both of the complex BPF 6 and the real filter 7 may be replaced with single-ended ones. Gm-C filters, OTA-C filters, passive filters including resistors, capacitors, and inductors, or polyphase filters may be used as the complex BPF 6 and the real filter 7.

The complex BPF 6 may be other than a Bessel band-pass filter. Examples include ones having a Butterworth characteristic, a Chebyshev characteristic, or a simultaneous Chebyshev characteristic or an elliptic characteristic.

The real filter 7 may be one having a Butterworth characteristic, a Chebyshev characteristic, or a simultaneous Chebyshev characteristic or an elliptic characteristic.

A common-mode feedback circuit, a bias circuit, a trimming circuit needed for filter frequency adjustment, and/or a tuning circuit may be additionally connected to the operational amplifiers (AP, AP1, and AP2) if needed.

In essence, the filter circuit according to the present invention extracts a signal component corresponding to a desired channel from frequency signals ($I_P$, $I_N$, $Q_P$, and $Q_N$) including signal components corresponding to a respective plurality of channels having respective different frequency bands by using the following first filter (6) and second filter (7). The first filter (6) performs filtering on the frequency signals ($I_P$, $I_N$, $Q_P$, and $Q_N$) with a band-pass characteristic such that the frequency band of the desired channel (CH1) is included in a passband, thereby obtaining pass frequency signals ($B_P$ and $B_N$). The second filter (7) performs filtering on the pass frequency signals ($B_P$ and $B_N$) with a filter characteristic such that the frequency band of a channel adjoining the desired channel is included in an attenuation band (CA1, CA3), and outputs signal components ($J_P$ and $J_N$) corresponding to the desired channel. In the present invention, the provision of the foregoing second filter (7) in the subsequent stage of the first filter (6) steepens the attenuation gradient of the band-pass characteristic of the first filter (6) in the attenuation band (CA1, CA3) while suppressing the amount of increase in the circuit scale.

This application is based on a Japanese Patent Application No. 2013-096885 which are hereby incorporated by reference.

What is claimed is:

1. A filter circuit for receiving an input frequency signal including signal components corresponding to a plurality of channels having respective different frequency bands and for extracting a signal component corresponding to a desired channel from said input frequency signal, the filter circuit comprising:
   a first filter which performs filtering on the input frequency signal with such a band-pass characteristic that the frequency band of the desired channel is included in a passband, thereby obtaining a pass frequency signal; and
   a second filter which performs filtering on the pass frequency signal with such a filter characteristic that a signal level of a frequency band of a channel adjoining the desired channel is attenuated,
   wherein an attenuation band of said second filter is included in a frequency band of an attenuation band of said first filter.

2. The filter circuit according to claim 1, wherein the second filter is a notch filter having a filter characteristic that provides a maximum attenuation at a center frequency of the adjoining channel.

3. The filter circuit according to claim 1, wherein the second filter is a low- or high-pass filter having a filter characteristic such that its cutoff frequency falls within an attenuation band of the first filter.

4. The filter circuit according to claim 1, wherein the second filter is a band-pass filter having a band-pass characteristic having a bandwidth equivalent to the passband of the first filter with a frequency different from a center frequency of the passband of the first filter at the center.

5. The filter circuit according to claim 1, wherein:
   both the first and second filters are an active filter including a resistor, a capacitor, and an operational amplifier; and
   the operational amplifier included in the second filter has a bias current smaller than that of the operational amplifier included in the first filter.

6. The filter circuit according to claim 5, wherein the resistor and the capacitor included in the second filter have a time constant smaller than that of the resistor and the capacitor included in the first filter.

7. The filter circuit according to claim 1, wherein the first filter is a Bessel band-pass filter.

8. The filter circuit according to claim 1, wherein the passband of the first filter is wider than the frequency band of the desired channel, and the first filter extracts signal components corresponding to the desired channel and the adjoining channel.

9. A receiving apparatus comprising:
   a mixer that mixes a high frequency signal with first and second local oscillation signals having a phase difference of 90° therebetween to generate first and second frequency signals, the high frequency signal being obtained by receiving a transmitted signal including a plurality of channels having respective different frequency bands; and
   a filter circuit that extracts an intermediate frequency signal corresponding to a desired channel from the first and second frequency signals,
   the filter circuit including
   a complex band-pass filter that performs complex filtering on the first and second frequency signals with such a band-pass characteristic that a frequency band of the desired channel is included in a passband, thereby obtaining a pass frequency signal, and
   a real filter that performs filtering on said pass frequency signal with such a filter characteristic that a signal level of a frequency band of a channel adjoining the desired channel is attenuated,
   wherein an attenuation band of said real filter is included in a frequency band of an attenuation band of said complex band-pass filter.

10. The receiving apparatus according to claim 9, wherein the real filter is a notch filter having a filter characteristic that provides a maximum attenuation at a center frequency of the adjoining channel.

11. The receiving apparatus according to claim 9, wherein the real filter is a low- or high-pass filter having a filter characteristic such that its cutoff frequency falls within an attenuation band of the complex band-pass filter.

12. The receiving apparatus according to claim 9, wherein the real filter is a band-pass filter having a band-pass characteristic having a bandwidth equivalent to the passband of the complex band-pass filter with a frequency different from a center frequency of the passband of the complex band-pass filter at the center.

13. The receiving apparatus according to claim 9, wherein:
both the complex band-pass filter and the real filter are an active filter including a resistor, a capacitor, and an operational amplifier; and
the operational amplifier included in the real filter has a bias current smaller than that of the operational amplifier included in the complex band-pass filter.

14. The receiving apparatus according to claim 13, wherein the resistor and the capacitor included in the real filter have a time constant smaller than that of the resistor and the capacitor included in the complex band-pass filter.

15. The receiving apparatus according to claim 9, wherein the complex band-pass filter is a Bessel band-pass filter.

16. The receiving apparatus according to claim 9, wherein the passband of the first filter is wider than the frequency band of the desired channel, and the first filter extracts signal components corresponding to the desired channel and the adjoining channel.

* * * * *